United States Patent
Hendrickson et al.

(10) Patent No.: US 7,639,535 B2
(45) Date of Patent: Dec. 29, 2009

(54) DETECTION AND CORRECTION OF DEFECTS IN SEMICONDUCTOR MEMORIES

(75) Inventors: Nicholas Hendrickson, Citrus Heights, CA (US); Gerald Barkley, Oregon, WI (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/601,124

(22) Filed: Nov. 17, 2006

(65) Prior Publication Data

US 2008/0117681 A1 May 22, 2008

(51) Int. Cl.
*G11C 11/34* (2006.01)

(52) U.S. Cl. ............................... 365/185.09; 365/185.24

(58) Field of Classification Search ............ 365/185.09, 365/200
See application file for complete search history.

(56) References Cited

U.S. PATENT DOCUMENTS

| | | | | |
|---|---|---|---|---|
| 5,402,376 A * | 3/1995 | Horiguchi et al. | ............ | 365/200 |
| 5,502,674 A * | 3/1996 | Griffus et al. | ............... | 365/200 |
| 5,703,816 A * | 12/1997 | Nam et al. | ................... | 365/200 |
| 5,748,534 A * | 5/1998 | Dunlap et al. | .......... | 365/185.21 |
| 6,304,488 B1 * | 10/2001 | Abedifard et al. | ...... | 365/185.23 |
| 6,335,652 B2 * | 1/2002 | Mueller et al. | ............... | 327/526 |
| 6,590,799 B1 * | 7/2003 | Rickes et al. | ................. | 365/145 |
| 6,842,377 B2 * | 1/2005 | Takano et al. | .......... | 365/185.21 |
| 6,947,322 B2 * | 9/2005 | Anzai et al. | ............ | 365/185.03 |
| 6,996,017 B2 * | 2/2006 | Scheuerlein et al. | ......... | 365/201 |
| 7,177,189 B2 * | 2/2007 | Linde et al. | ............ | 365/185.09 |
| 7,257,039 B2 * | 8/2007 | Bedeschi et al. | ............ | 365/203 |
| 7,321,516 B2 * | 1/2008 | Di Martino et al. | .... | 365/189.09 |
| 2001/0002112 A1 * | 5/2001 | Mueller et al. | ............... | 327/526 |
| 2002/0097623 A1 * | 7/2002 | Suzuki et al. | ................ | 365/210 |
| 2002/0176306 A1 * | 11/2002 | Abe et al. | .................... | 365/226 |
| 2003/0043664 A1 * | 3/2003 | Haraguchi et al. | .......... | 365/201 |
| 2003/0214861 A1 * | 11/2003 | Takano et al. | ................ | 365/200 |
| 2004/0062096 A1 * | 4/2004 | Tanabe et al. | ................ | 365/200 |
| 2005/0174844 A1 * | 8/2005 | So et al. | ................. | 365/185.03 |
| 2005/0195637 A1 * | 9/2005 | Martino et al. | ............... | 365/149 |
| 2005/0278073 A1 * | 12/2005 | Roth | .......................... | 700/282 |

* cited by examiner

*Primary Examiner*—Michael T Tran
(74) *Attorney, Agent, or Firm*—Trop, Pruner & Hu, P.C.

(57) ABSTRACT

A non-volatile memory may have memory portions, such as blocks or other granularities of units of memory, which may fail in actual use. These defective portions can be replaced with other portions which may, in some cases, be of corresponding size. In some embodiments, defects may be detected using a current sensor which detects the current drawn in actual operation. If an excessive current is drawn, this may be detected, the defective unit deactivated, and a replacement provided in its stead. This may result in the repair of a defect with little inconvenience to the user in some embodiments.

16 Claims, 3 Drawing Sheets

DETECTION AND CORRECTION OF DEFECTS IN SEMICONDUCTOR MEMORIES

BACKGROUND

This relates generally to semiconductor memories such as flash memories.

Many memories, such as flash memories, are extensively tested in the fabrication facility. If the memory passes those tests, the integrated circuit may be released for sale and use. In some cases, these memories have redundant memory portions which can be activated if one portion of a memory array is defective. Thus, in the fabrication facility, the defective array portion can be activated to replace a defective portion.

However, in many cases, defects do not appear until the product is out in the market. The testing undergone in the fabrication facility cannot duplicate all real life conditions. In addition, some conditions may arise only with sufficient cycling of the memory over time. Cycling or endurance is the ability of the memory to be repeatedly programmed and erased. The inability to continue to operate after a number of cycles is generally termed an endurance failure.

Many integrated circuits, including memories, are used in mission critical applications. In some cases, resources may depend on the accurate operation of the integrated circuit over an extended number of cycles.

DETAILED DESCRIPTION

In accordance with some embodiments of the present invention, defects may be detected in memory arrays during normal operation. As used herein, normal operation relates to the use of the memory by the end user after testing in the fabrication facility and after the memory has left the facility wherein it was manufactured.

The fact that the memory array is drawing excessive current may indicate that, as a result of cycling, a portion of the memory array is no longer operating correctly. One effect of cycling on flash memories, for example, is that the columns leak current. This causes program verify faults or read faults. Rather than simply require replacement of the entire memory array, the detection of the defect can be used to automatically repair the memory. In one embodiment, the repair may be implemented by reprogramming the memory to replace a defective portion of the memory array with a redundant portion. A redundant portion is a group of one or more spare memory cells used for replacement of a defective cell or group of cells.

Figure 1:
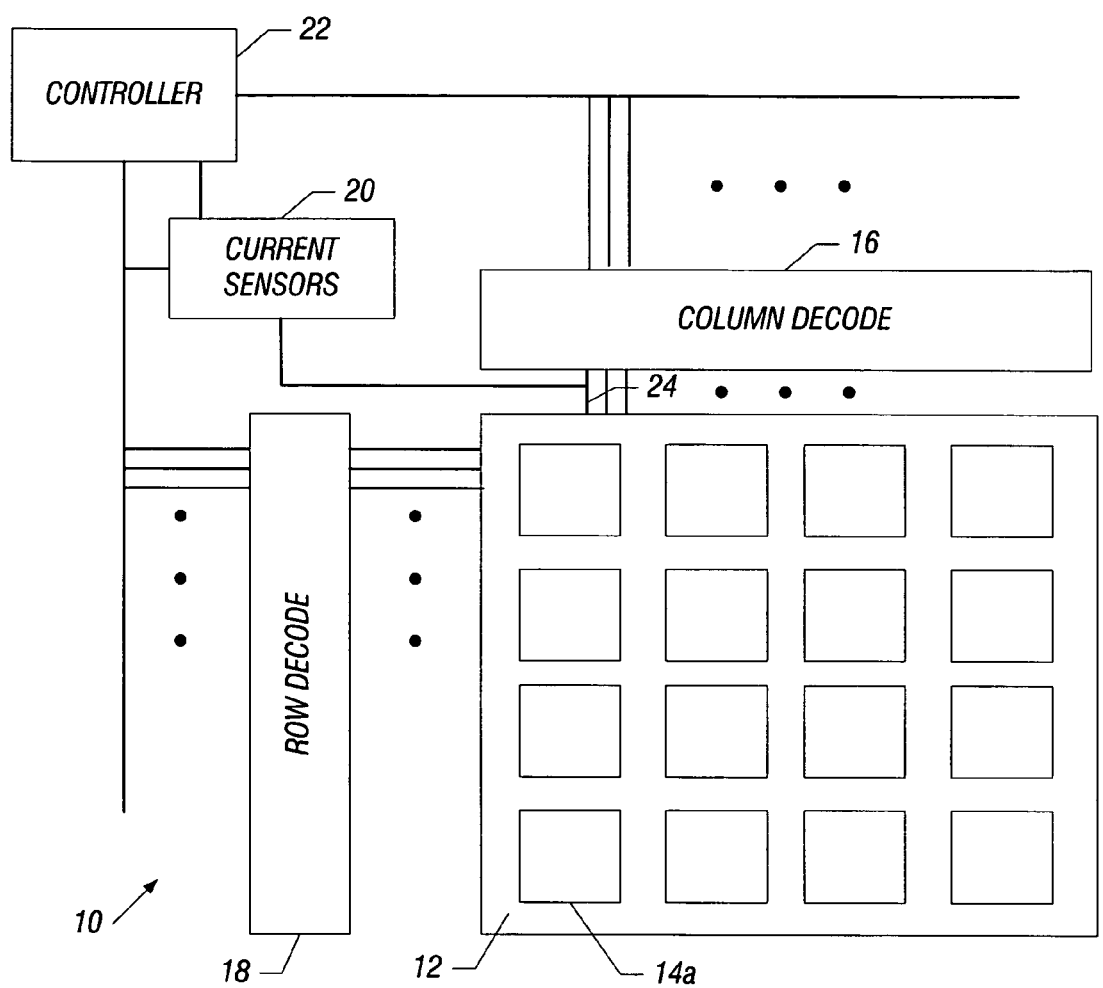
FIG. 1 is a depiction of one embodiment of the present invention.

Referring to FIG. 1, in accordance with one embodiment, a non-volatile memory 10, such as a flash memory, may include a memory array 12 with a number of cells arranged in groups 14 such as blocks of memory arrays. Each of the groups 14 may be separately addressable. A redundant group 14a may be provided. The memory 10 may also be an erasable programmable read only memory (EPROM), an electrically erasable programmable read only memory ($E^2$PROM), an ovonic memory, a polymer memory, a ferromagnetic memory, or a static random access memory, as additional examples.

While an array is described which is broken up into blocks, other units may be used as well. The array may be broken up into sections of any granularity and the granularity of the portions of the array is of no importance. Generally, it may be advantageous that the replaceable portion may be replaceable by a similarly sized portion, be it a block, a row, a column, a sector, a cell, or whatever.

Thus, if a given group 14 is defective, the array may be reprogrammed so that a redundant portion 14a may be used in its place. The array may be addressed through address lines 14 coupled to column decoders 16 and row decoders 18.

The row decoders 18 and column decoders 16 may be coupled to a controller 22. Also coupled to the controller 22 may be a number of current sensors 20 which may be coupled to different address lines 24.

The current sensor 20 detects when an excessive amount of current is being drawn by a portion of the array 12. This may indicate, depending on the circumstances, that the group drawing the excessive current is defective and should be replaced with a redundant group. Thus, the current sensor 20 may notify the controller 22 of the defect. The controller 22 may then reprogram the array so that the redundant group 14a is accessed in place of the defective group 14. If possible, in some cases, data stored on the defective group 14 may be transferred to the redundant group 14a.

In some embodiments, the sensor 20 uses negative feedback to generate a control voltage on the gate of the transistor 34. The control voltage is then measured to determine the current drawn by the group of cells under test.

Thus, over the life of the memory 10, as defects appear in groups 14 of the memory array, these defects can be detected and repaired, with little or no inconvenience to the user in some embodiments.

Figure 2:
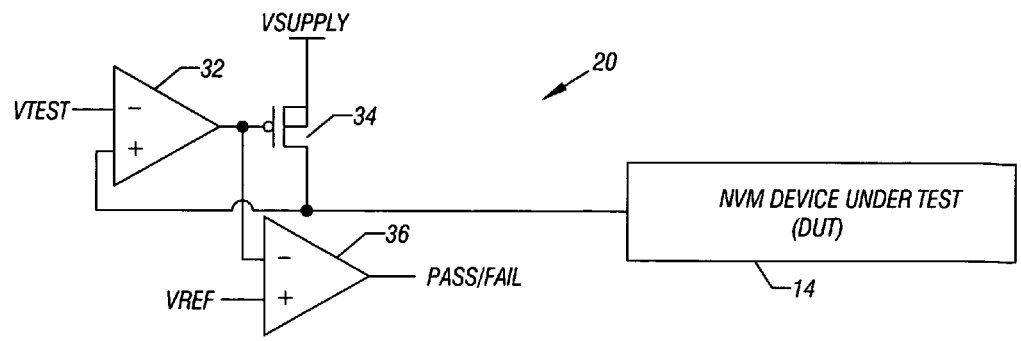
FIG. 2 is a depiction of a detector in accordance with one embodiment.

Referring to FIG. 2, in accordance with one embodiment, the current sensor 20 may include a pair of operational amplifiers 32 and 36. Other designs may be used as well, but the design depicted in FIG. 2 may be advantageous since it is relatively inexpensive and does not take up a lot of real estate on the memory 10 die.

The operational amplifier 32 may receive a signal VTEST on its inverting input. Its output may be coupled to a PMOS metal oxide semiconductor (MOS) transistor 34. The source of the transistor 34 may be coupled to a supply voltage VSUPPLY and the drain may be coupled to the non-inverting input of the operational amplifier 32. The drain of the transistor 34 may also be coupled to a device under test 14. The device under test 14 may be any portion of the array 12 which is to be tested.

Thus, if the group 14 is defective, for example drawing excessive current, the non-inverting input of the operational amplifier 32 has its voltage altered, changing the output voltage as a result and changing the drive on the transistor 34.

Also coupled to the gate of the transistor 34 is an operational amplifier 36. The gate of the transistor 34 and the output of the operational amplifier 32 are coupled to the inverting input of the operational amplifier 36. A reference voltage is provided to the non-inverting input. If the voltage on the gate of the transistor 34 is sufficiently different from the reference voltage, a pass or fail signal may be provided from the output of the current sensor 20. This output is provided to the controller 22 and may be used by the controller for reprogramming the way the array 12 is addressed. Namely, a defective group 14 may be replaced with a corresponding redundant group 14a in some embodiments.

Figure 3:
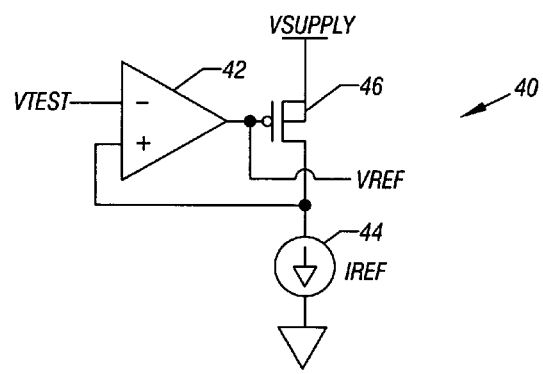
FIG. 3 is a depiction of one embodiment of a reference generator.

Referring to FIG. 3, the generation of the reference voltage, in accordance with one embodiment, is illustrated. In this embodiment, an operational amplifier 42 has its inverting input coupled to the signal VTEST. Its non-inverting input is coupled to the drain of a PMOS MOS transistor 46. The reference generator 40 may include a PMOS transistor 46 also coupled to the supply voltage VSUPPLY. A current source 44, called IREF, provides a reference current. Thus, the reference generator 40 outputs the signal VREF, which provides the reference voltage to the operational amplifier 36, shown in FIG. 2.

Figure 4:
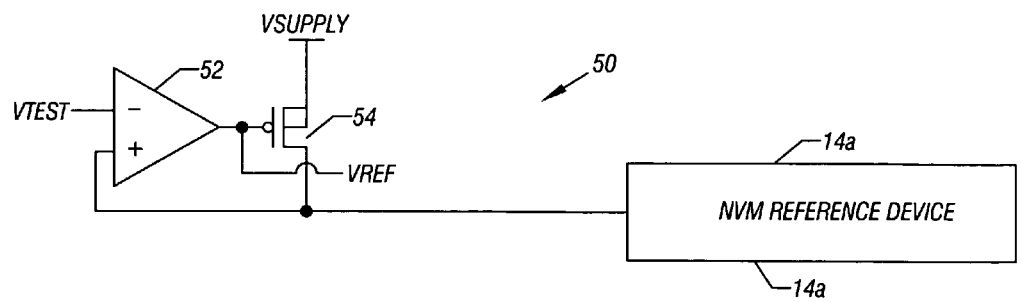
FIG. 4 is a depiction of another embodiment of a reference generator.

Referring to FIG. 4, as still another example of a reference generator, the reference generator 50 may include a transistor 54 coupled to the supply voltage VSUPPLY. Again, in one embodiment, the transistor 54 may be a PMOS transistor. A reference device, corresponding to the group 14, may be provided to provide a reference level indicating the current drawn on a functional, non-defective group of cells of the array 12. Thus, for example, the reference device may be a redundant array portion comparable to the array portion under test.

The current drawn by the reference device 14a results in a voltage on the drain of the transistor 54 also coupled to the non-inverting input of the operational amplifier 52. The output of the operational amplifier 52 drives the gate of the transistor 54 and also provides the reference voltage VREF for the operational amplifier 36 of FIG. 2.

In some embodiments, the testing may be done at a target voltage, measuring a bias voltage rather than performing the test at a target current measuring the resulting voltage, which may result in undesired stress voltages. In some embodiments, a relatively large operating range may be achieved. The test voltage VTEST can vary from almost VSUPPLY to ground, depending on the design.

Figure 5:
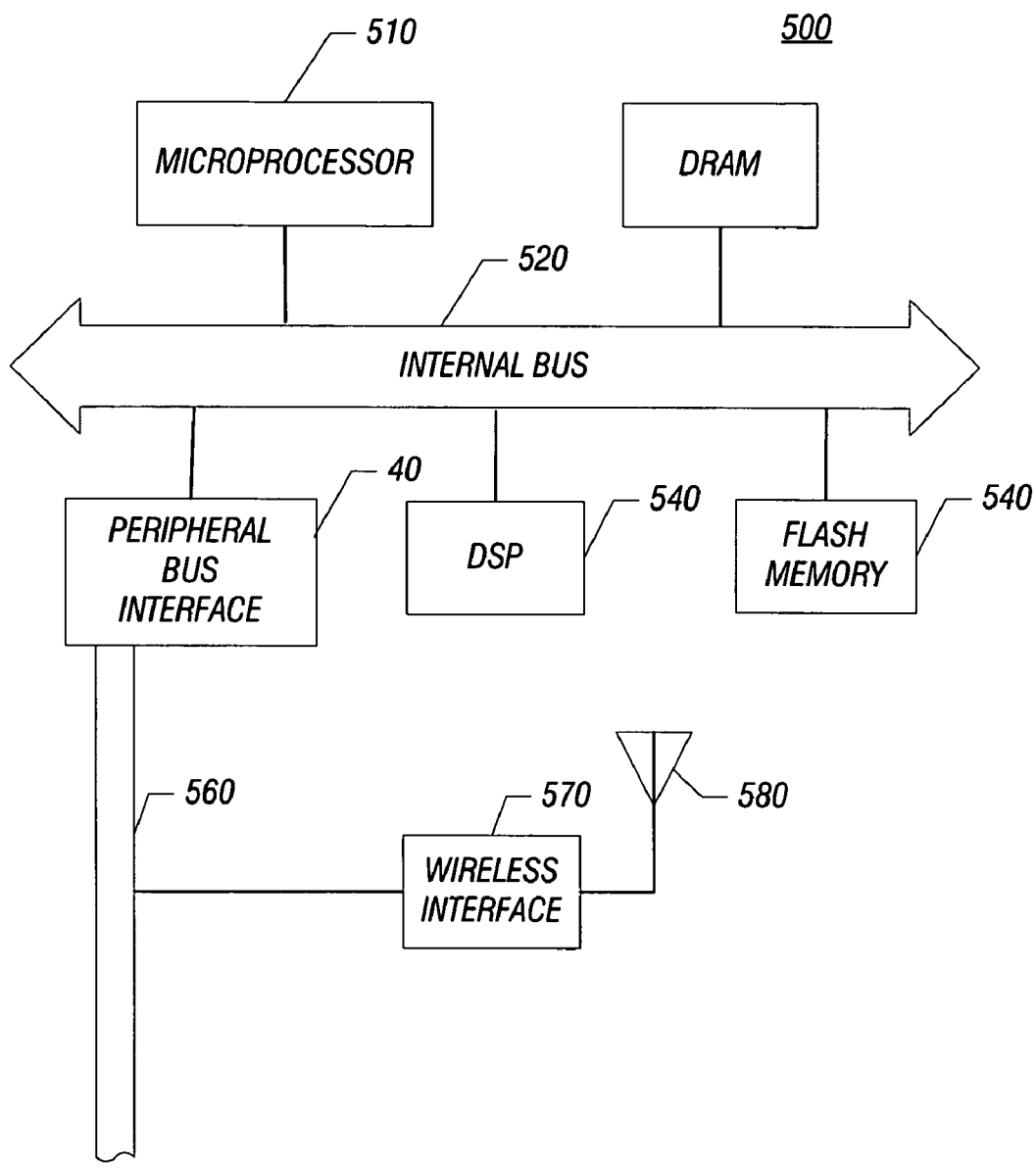
FIG. 5 is a system depiction in accordance with one embodiment of the present invention.

FIG. 5 is a block diagram of a wireless device with which embodiments of the present invention may be used. As shown in FIG. 5, in one embodiment, a wireless device 500 includes a processor 510, which may include a general purpose or special purpose processor, such as a microprocessor, microcontroller, application specific integrated circuit (ASIC), or a programmable gate array (PGA), to mention a few examples. The processor 510 may be coupled to a digital signal processor (DSP) 530 via an internal bus 520. A flash memory 540 may be coupled to the internal bus 520. In one embodiment, the flash memory 540 may be implemented by the memory 10.

As shown in FIG. 5, the processor 510 may also be coupled to a peripheral bus interface 550 and a peripheral bus 560. Many devices may be coupled to the peripheral bus 560 including a wireless interface 570, coupled to an antenna 580. In various embodiments, the antenna 580 may be a dipole antenna, a helical antenna, a global system for mobile communications (GSM) antenna or any other such antenna. A dynamic random access memory (DRAM) 590 may also be coupled to the internal bus 520.

While the description makes reference to specific components of the device 500, it is contemplated that many modifications and variations may be possible. Moreover, while FIG. 5 shows a block diagram of a wireless device, embodiments may be implemented in a system such as a personal computer, a server, or the like. In such embodiments, a flash memory may be coupled to an appropriate bus, such as the peripheral component interconnect (PCI) bus, as defined PCI Local Bus Specification, Production Version, Revision 2.1, dated January 1995 or any other bus.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

providing a control voltage to the gate of a transistor that supplies current to the defective portion of a non-volatile memory;

detecting a defective portion of a non-volatile memory in normal operation by using an operational amplifier to determine the voltage of a node coupled to the portion and using a second operational amplifier coupled to the output of the first operational amplifier to measure the current of the defective portion of the non-volatile memory in normal operation; and in response to said detection, replacing the defective portion with a redundant memory portion.

2. The method of claim 1 wherein detecting includes monitoring the current drawn by the defective portion.

3. The method of claim 1 including using a reference device to establish a reference voltage.

4. The method of claim 1 including using as a reference device, a group of functional memory cells corresponding to the portion of the non-volatile memory being detected.

5. The method of claim 1 including using a PMOS transistor to supply current to a device under test.

6. A memory comprising:

a memory array;

a current sensor coupled to said array to detect when a portion of said array is defective in normal use, said sensor including a first operational amplifier to determine voltage of a node coupled to the portion and a second operational amplifier coupled to the first operational amplifier to measure the current of the portion in normal operation; and a controller coupled to said current sensor to replace a defective portion of said array with a redundant portion of said array.

7. The memory of claim 6 wherein said memory is a flash memory.

8. The memory of claim 6 wherein said sensor uses negative feedback.

9. The memory of claim 8, said sensor including a PMOS transistor coupled to said array.

10. The memory of claim 9 wherein said sensor includes a first operational amplifier and the PMOS transistor includes a gate coupled to said first operational amplifier, said first operational amplifier to compare an input voltage to a test voltage.

11. The memory of claim 10 wherein said input voltage is a voltage at the drain of said PMOS transistor.

12. The memory of claim 11 wherein said drain is coupled to said first operational amplifier and to said portion of said array.

13. The memory of claim 12 wherein the output of said first operational amplifier is compared to a reference voltage to determine whether a portion of the memory array is drawing excessive current.

14. The memory of claim 13 including a second operational amplifier to compare the output from said first operational amplifier to a reference voltage.

15. The memory of claim 14 wherein said reference voltage is determined using a constant current source.

16. The memory of claim 14 wherein said reference voltage is determined using a reference array portion.

* * * * *